(12) United States Patent
Tenghamn et al.

(10) Patent No.: US 11,871,675 B2
(45) Date of Patent: Jan. 9, 2024

(54) SEISMIC PRESSURE AND ACCELERATION MEASUREMENT

(71) Applicant: PGS Geophysical AS, Oslo (NO)

(72) Inventors: Stig Rune Lennart Tenghamn, Houston, TX (US); David Thomas Booth, Houston, TX (US)

(73) Assignee: PGS Geophysical AS, Oslo (NO)

( * ) Notice: Subject to any disclaimer, the term of this patent is extended or adjusted under 35 U.S.C. 154(b) by 0 days.

(21) Appl. No.: 17/893,872

(22) Filed: Aug. 23, 2022

(65) Prior Publication Data

US 2022/0406988 A1 Dec. 22, 2022

Related U.S. Application Data (63) Continuation of application No. 16/348,600, filed as application No. PCT/US2018/065935 on Dec. 17, 2018, now abandoned.

(Continued)

(51) Int. Cl.
*G01V 1/18* (2006.01)
*G01V 1/36* (2006.01)
(Continued)

(52) U.S. Cl.
CPC ............. *H10N 30/302* (2023.02); *G01L 1/16* (2013.01); *G01P 15/08* (2013.01); *G01V 1/186* (2013.01);
(Continued)

(58) Field of Classification Search
CPC ....... H01L 41/1132; G01L 1/16; G01L 23/10; G01L 27/005; G01P 15/08; G01P 15/09;
(Continued)

(56) References Cited

U.S. PATENT DOCUMENTS

| | | |
|---|---|---|
| 3,202,736 A | 8/1965 | Horan et al. |
| 3,832,762 A | 9/1974 | Johnston et al. |

(Continued)

FOREIGN PATENT DOCUMENTS

| | | |
|---|---|---|
| AU | 2003 200 979 | 10/2003 |
| CA | 1 030 647 | 5/1978 |

(Continued)

OTHER PUBLICATIONS

International Preliminary Report on Patentability for PCT Application PCT/US2018065974, dated Jun. 25, 2020.

(Continued)

*Primary Examiner* — Daniel L Murphy
*Assistant Examiner* — Amie M Ndure (57) ABSTRACT

A plurality of sensors and a controller are disposed in a marine seismic streamer. Each of the sensors comprises an enclosure having two opposing interior walls, first and second piezoelectric elements disposed on the opposing interior walls, a third piezoelectric element disposed on a flexible substrate within the enclosure between the opposing interior walls, a pressure signal output node and an acceleration signal output node disposed on the exterior surface of the enclosure. A combined pressure signal derived from the pressure signal output nodes of the plural sensors is coupled to a pressure signal input of the controller. A combined acceleration signal derived from the acceleration signal output nodes of the plural sensors is coupled to an acceleration signal input of the controller. The streamer may be towed, and the combined pressure and acceleration signals may be recorded in a computer-readable medium.

19 Claims, 6 Drawing Sheets

Related U.S. Application Data (60) Provisional application No. 62/599,392, filed on Dec. 15, 2017.

(51) Int. Cl.
  *G01V 1/20* (2006.01)
  *G01L 1/16* (2006.01)
  *H10N 30/30* (2023.01)
  *G01V 1/38* (2006.01)
  *G01P 15/08* (2006.01)

(52) U.S. Cl.
  CPC ............ *G01V 1/201* (2013.01); *G01V 1/3808* (2013.01); *G01V 2210/1423* (2013.01); *G01V 2210/32* (2013.01)

(58) Field of Classification Search
  CPC ........ G01P 21/00; G01V 1/186; G01V 1/201; G01V 1/3808; G01V 2210/1423; G01V 2210/32; G01V 1/375; G01V 1/005; G01V 1/366; G01V 1/38; G01V 2210/127; G01V 1/3861; G01V 1/37; G01V 1/3843; G01V 2210/1293; G01V 1/307; G01V 13/00; G01V 1/164; G01V 1/187; G01V 1/189; G01V 1/006; H04R 1/02; H04R 1/44; H04R 1/42; G01H 11/08
  See application file for complete search history.

(56) References Cited

U.S. PATENT DOCUMENTS

| | | | |
|---|---|---|---|
| 3,970,878 A | 7/1976 | Berglund | |
| 4,017,824 A | 4/1977 | Fife et al. | |
| 4,162,476 A | 7/1979 | Fanning | |
| 4,163,206 A * | 7/1979 | Hall, Jr. | G01V 1/189 367/160 |
| 4,228,532 A | 10/1980 | Sims | |
| 4,356,423 A | 10/1982 | Gudzin | |
| 5,646,470 A * | 7/1997 | de Groot | G01H 11/08 367/157 |
| 6,029,113 A | 2/2000 | Woodall | |
| 6,108,267 A | 8/2000 | Pearce | |
| 6,160,763 A | 12/2000 | Cole | |
| 6,607,050 B2 * | 8/2003 | He | G01V 1/201 367/20 |
| 6,725,164 B1 * | 4/2004 | Bednar | G01V 1/16 702/2 |
| 6,754,136 B2 | 6/2004 | Constantinou et al. | |
| 7,424,928 B2 * | 9/2008 | Cox | G01V 1/523 181/111 |
| 7,800,595 B2 | 9/2010 | Hill | |
| 8,712,694 B2 * | 4/2014 | Edme | G01V 1/366 702/17 |
| 8,730,766 B2 | 5/2014 | Lambert et al. | |
| 8,838,392 B2 * | 9/2014 | Halliday | G01V 1/189 367/40 |
| 9,091,783 B2 * | 7/2015 | Edme | G01V 1/28 |
| 9,110,187 B2 * | 8/2015 | Muyzert | G01V 1/20 |
| 9,594,174 B2 * | 3/2017 | Goujon | G01V 13/00 |
| 9,989,555 B2 * | 6/2018 | Keast | G01V 1/18 |
| 10,241,220 B2 | 3/2019 | Pearce | |
| 10,534,099 B2 | 1/2020 | Tenghamn | |
| 2011/0182140 A1 * | 7/2011 | Lambert | G01V 1/18 367/24 |
| 2012/0163119 A1 | 6/2012 | Pearce | |
| 2012/0163120 A1 | 6/2012 | Pearce et al. | |
| 2013/0042695 A1 | 2/2013 | Barr et al. | |
| 2013/0127471 A1 | 5/2013 | Sudow et al. | |
| 2015/0063062 A1 | 3/2015 | Fernihough | |
| 2015/0101731 A1 | 4/2015 | Hepp | |
| 2017/0031040 A1 | 2/2017 | Goenner et al. | |
| 2018/0106666 A1 | 4/2018 | Tenghamn et al. | |
| 2018/0106915 A1 | 4/2018 | Tenghman et al. | |
| 2018/0321419 A1 | 11/2018 | Tenghamn et al. | |
| 2018/0324507 A1 | 11/2018 | Tenghamn et al. | |
| 2018/0329094 A1 | 11/2018 | Goenner et al. | |
| 2020/0363545 A1 | 11/2020 | Booth | |
| 2021/0080601 A1 | 3/2021 | Fernihough | |

FOREIGN PATENT DOCUMENTS

| | | |
|---|---|---|
| EP | 0 237 616 A2 | 9/1987 |
| EP | 3 312 638 A1 | 4/2018 |
| GB | 1 435 125 A | 5/1976 |
| GB | 2 227 317 A | 7/1990 |
| GB | 2493837 | 2/2013 |
| GB | 2515658 | 12/2014 |
| KR | 20170078382 | 7/2017 |
| WO | 2015048494 A1 | 4/2015 |

OTHER PUBLICATIONS

International Search Report and Written Opinion for PCT Application PCT/US2018065974, dated Apr. 12, 2019.
International Preliminary Report on Patentability for PCT Application PCT/US2018065935, dated Jun. 25, 2020.
International Search Report and Written Opinion for PCT Application PCT/US2018065935, dated Mar. 18, 2019.
International Search Report and Written Opinion in PCT/EP2019/064947 dated Oct. 9, 2010.
"T-2 Hydrophone" data sheet (Teledyne Geophysical Instruments, Jun. 2006).
"T-2BX Hydrophones" data sheet (Teledyne Geophysical Instruments, May 2008).

* cited by examiner

SEISMIC PRESSURE AND ACCELERATION MEASUREMENT

CROSS-REFERENCE TO RELATED APPLICATIONS

This application is a Continuation of U.S. Non-Provisional application Ser. No. 16/348,600, filed on May 5, 2019, which is a National Stage Application under 35 USC § 371 of International Application No. PCT/US2018/065935, filed on Dec. 17, 2018, which claims the benefit of U.S. Provisional Application 62/599,392, filed Dec. 15, 2017, all of which are hereby incorporated by reference in their entirety as if fully set forth herein.

BACKGROUND

In the past few decades, the petroleum industry has invested heavily in the development of marine survey techniques that yield knowledge of subterranean formations beneath a body of water in order to find and extract valuable mineral resources, such as oil. High-resolution images of a subterranean formation are helpful for quantitative interpretation and improved reservoir monitoring. For a typical marine survey, a marine survey vessel tows one or more marine survey sources below the sea surface and over a subterranean formation to be surveyed. Marine survey receivers may be located on or near the seafloor, on one or more streamers towed by the marine survey vessel, or on one or more streamers towed by another vessel. The marine survey vessel typically contains marine survey equipment, such as navigation control, source control, receiver control, and recording equipment. The source control may cause the one or more marine survey sources, which can be impulsive sources such as air guns, non-impulsive sources such as marine vibrator sources, electromagnetic sources, etc., to produce signals at selected times. Each signal is essentially a wave called a wavefield that travels down through the water and into the subterranean formation. At each interface between different types of rock, a portion of the wavefield may be refracted, and another portion may be reflected, which may include some scattering, back toward the body of water to propagate toward the sea surface. The marine survey receivers thereby measure a wavefield that was initiated by the actuation of the marine survey source.

DETAILED DESCRIPTION

This disclosure is related generally to the field of marine surveying. Marine surveying can include, for example, seismic and/or electromagnetic surveying, among others. For example, this disclosure may have applications in marine surveying, in which one or more source elements are used to generate wavefields, and sensors (towed and/or ocean bottom) receive energy generated by the source elements and affected by the interaction with a subsurface formation. The sensors thereby collect survey data, which can be useful in the discovery and/or extraction of hydrocarbons from subsurface formations.

Pressure and motion sensors are used in the seismic industry. Examples of sensors or sensor elements include hydrophones and accelerometers. As used herein, "hydrophone" refers to a unit including a piezoelectric structure that can be used to measure pressure such as pressure caused by seismic events. An accelerometer can include a piezoelectric structure and detects acceleration such as particle displacement within the water by detecting acceleration variation, as compared to the hydrophone which may detect pressure variation.

In some previous approaches, sensor noise such as sensor acceleration noise is reduced in hydrophone measurements using a piezoelectric crystal that creates a voltage when it bends due to a change in pressure. However, the crystal may also bend and create a voltage when subjected to acceleration in a direction having a vector component perpendicular to the face of that crystal. This bending is due to the crystal's mass. In such an approach, two crystals can be used in a hydrophone and they can be arranged and wired to create a voltage signal that represents pressure but attenuates a voltage signal caused by the acceleration of the hydrophone. Some other approaches use two bender-type hydrophones that work together to cancel out sensor acceleration because bender-type hydrophones are sensitive to acceleration.

In other approaches, a dual sensor streamer can be used to measure pressure and acceleration. The number of sensors can be increased and deghosting at receivers can be performed. However, as the number of sensors increases, longer and slimmer streamers may be desired. As a result, more sensors and simpler designs may be desired to implement the increase in sensors. The sensor increase may be desired to keep the sensor noise level at a particular level. Such sensors can include passive accelerometer-based sensors on piezoceramic piezoelectric structures or microelectromechanical systems (MEMS) sensors, among others.

In contrast, at least one embodiment of the present disclosure includes the collection and measurement of signals from a sensor comprising both a motion sensor such as an accelerometer to measure acceleration and hydrophones to measure pressure. This allows for more accurate survey data collection, improved noise performance, and reduced sensor noise. Examples of motion sensors such as accelerometers include moving coil and magnet geophones. Triple-crystals can be used to measure both pressure and acceleration. Crystals are referred to herein as piezoelectric structures but may be other structures in at least one embodiment. In at least one embodiment, the accelerometer has direction sensitivity allowing for vertical and horizontal components of acceleration. A vertical component is a component of a wavefield that in a vertical plane. A horizontal component is a component of a wavefield that is in a horizontal plate orthogonal to the vertical plane. The vertical components can be used to reduce ghost reflections ("deghosting") and improve seismic data accuracy. A person of ordinary skill in the art will understand that deghosting accounts for the fact that the sea-surface reflects seismic energy back into the water layer such that any seismic event is recorded twice: first as an up-going wavefield that has been reflected by the subsurface, and then as a ghost, which is the down-going field that has been reflected by the sea-surface. Receiver deghosting can include identifying the vertical component of the wavefield and using that vertical component to identify and compensate for the ghost effect, creating a single event response. The single event response can look at either the up-going wavefield or the down-going wavefield. Signals of pressure sensors and motion sensors located in marine seismic streamers can be combined to generate pressure sensor data and particle motion data with substantially the same broad bandwidth. The measured pressure signal, at low frequencies, can be used to replace a portion of the motion signal, thereby reducing the noise in the combined detected signal. The noisy low frequency part of the motion signals is calculated from the recorded pressure signals and merged with the non-noisy motion signals. The two broad bandwidth data sets can then be combined to calculate the full up- and down-going wavefields.

At least one embodiment of the present disclosure allows for obtaining and measuring two voltage signals from the sensor, one being representative of pressure with acceleration, and the other being representative of acceleration. In at least one embodiment, the pressure is pressure with attenuated acceleration. Attenuated acceleration, in at least one embodiment, includes acceleration being canceled out or removed from particular pressure measurements, such as those made by bender hydrophones. In such an example, a need for additional motion sensors may be reduced or eliminated. In addition, noise performance of streamers described herein can be improved as compared to the noise performance of streamers that make use of other approaches. As used herein, "noise performance" refers to how much noise from various noise sources can be reduced relative to other approaches. Noise sources can include, but are not limited to, ghost reflections, waves in a fluid volume, movement of the streamers, and components of or coupled to the streamers. By utilizing both hydrophones and accelerometers, accuracy can be improved, and the likelihood of noise can be reduced and thereby increase the noise performance.

In addition, arrays in accordance with the present disclosure can be created in a streamer with a plurality of channels for a reduced cost as compared to other approaches because the same sensor can be used for both pressure and acceleration measurements. For instance, for a 12.5 meters (m) array, 8 to 32 sensors can be used. The sensors can be lower cost as compared to other sensors and may need little or no modification to make them useful for sensing both acceleration and pressure. In at least one embodiment, two arrays can be created perpendicular to one another to be able to measure both the vertical and horizontal components.

In at least one embodiment, different array lengths such as 6.25 m or 3.125 m can be used, and desired noise reduction can be attained with sensors spaced at 0.2- to 0.3 m increments. At least one embodiment of the present disclosure can be advantageous in that having a large number of sensors, such as hydrophones and accelerometers, can result in improved noise performance. The noise performance, in at least one embodiment, can be proportional to the square root of the number of sensors. At least one embodiment of the present disclosure can simplify and reduce a cost of a multi-component sensor and can improve noise performance of streamers.

It is to be understood that the present disclosure is not limited to particular devices or methods, which may, of course, vary. It is also to be understood that the terminology used herein is for the purpose of describing particular embodiments only and is not intended to be limiting. As used herein, the singular forms "a", "an", and "the" include singular and plural referents unless the content clearly dictates otherwise. Furthermore, the word "may" is used throughout this application in a permissive sense (having the potential to, being able to), not in a mandatory sense (must). The term "include," and derivations thereof, mean "including, but not limited to." The term "coupled" means directly or indirectly connected.

The figures herein follow a numbering convention in which the first digit or digits correspond to the drawing figure number and the remaining digits identify an element or component in the drawing. Similar elements or components between different figures may be identified by the use of similar digits. For example, 225 may reference element "25" in FIG. 2, and a similar element may be referenced as 325 in FIG. 3. Multiple analogous elements within one figure may be referenced with a reference numeral followed by a hyphen and another numeral or a letter. For example, 327-1 may reference element 27-1 in FIGS. 3 and 327-2 may reference element 27-2, which can be analogous to element 27-1. Such analogous elements may be generally referenced without the hyphen and extra numeral or letter. For example, elements 327-1 and 327-2 may be generally referenced as 327. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

Figure 1:
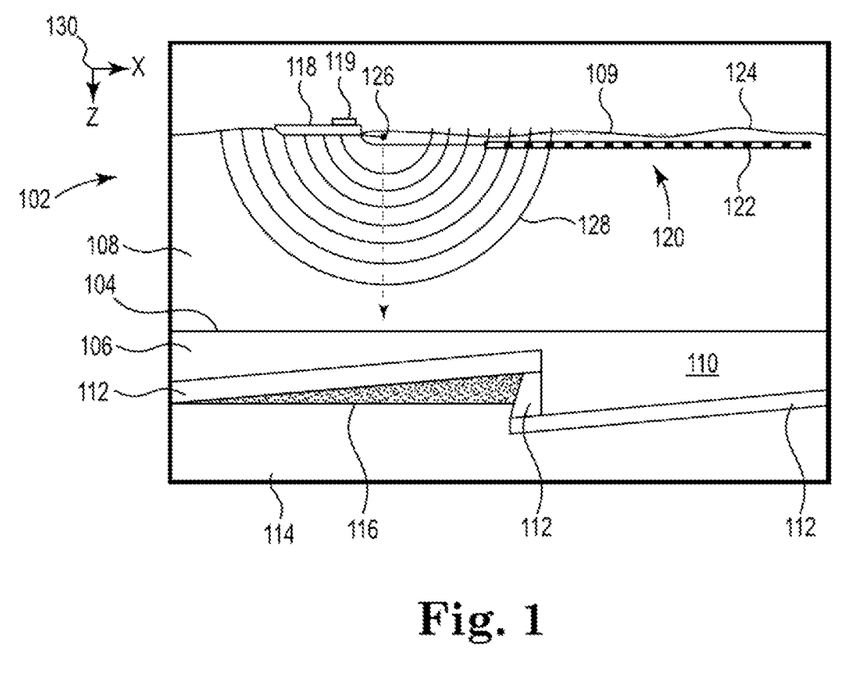
FIG. 1 is an elevation or xz-plane view of an example of a marine survey in which signals are emitted by a marine survey source for recording by marine survey receivers.

FIG. 1 illustrates an elevation or xz-plane 130 view of a marine survey in which signals are emitted by a marine survey source 126 for recording by marine survey receivers 122. The recording can be used for processing and analysis in order to help characterize the structures and distributions of features and materials underlying the surface of the earth. For example, the recording can be used to estimate a physical property of a subsurface location, such as the presence of a reservoir that may contain hydrocarbons. FIG. 1 shows a domain volume 102 of the earth's surface comprising a subsurface volume 106 of sediment and rock below the surface 104 of the earth that, in turn, underlies a fluid volume 108 of water having a sea surface 109 such as in an ocean, an inlet or bay, or a large freshwater lake. The domain volume 102 shown in FIG. 1 represents an example experimental domain for a class of marine surveys. FIG. 1 illustrates a first sediment layer 110, an uplifted rock layer 112, underlying rock layer 114, and hydrocarbon-saturated layer 116. One or more elements of the subsurface volume 106, such as the first sediment layer 110 and the uplifted rock layer 112, can be an overburden for the hydrocarbon-saturated layer 116. In some instances, the overburden may include salt.

FIG. 1 shows an example of a marine survey vessel 118 equipped to carry out marine surveys. In particular, the marine survey vessel 118 can tow one or more streamers 120 (shown as one streamer for ease of illustration) generally located below the sea surface 109. The streamers 120 can be long cables containing power and data-transmission lines (e.g., electrical, optical fiber, etc.) to which marine survey receivers may be coupled. In one type of marine survey, each marine survey receiver, such as the marine survey receiver 122 represented by the shaded disk in FIG. 1, comprises a pair of sensors that detects particle displacement within the water by detecting acceleration variation, such as velocities or accelerations, and/or a hydrophone that detects variations in pressure as described herein. In one type of marine survey, each marine survey receiver, such as marine survey receiver 122, comprises an electromagnetic receiver that detects electromagnetic energy within the water. The streamers 120 and the marine survey vessel 118 can include sensing electronics and data-processing facilities that allow marine survey receiver readings to be correlated with absolute positions on the sea surface and absolute three-dimensional positions with respect to a three-dimensional coordinate system. In FIG. 1, the marine survey receivers along the streamers are shown to lie below the sea surface 109, with the marine survey receiver positions correlated with overlying surface positions, such as a surface position 124 correlated with the position of marine survey receiver 122. The marine survey vessel 118 can include a controller 119, which can be used for operations associated with a pressure and acceleration sensor as described herein.

The marine survey vessel 118 can tow one or more marine survey sources 126 that produce signals as the marine survey vessel 118 and streamers 120 move across the sea surface 109. Although not specifically illustrated, the marine survey sources 126 can include a plurality of marine non-impulsive sources above, below, or in-line with the streamer 120. Marine survey sources 126 and/or streamers 120 may also be towed by other vessels or may be otherwise disposed in fluid volume 108. For example, marine survey receivers may be located on ocean bottom cables or nodes fixed at or near the surface 104, and marine survey sources 126 may also be disposed in a nearly-fixed or fixed configuration. For the sake of efficiency, illustrations and descriptions herein show marine survey receivers located on streamers, but it should be understood that references to marine survey receivers located on a "streamer" or "cable" should be read to refer equally to marine survey receivers located on a towed streamer, an ocean bottom receiver cable, and/or an array of nodes.

FIG. 1 shows acoustic energy illustrated as an expanding, spherical signal, illustrated as semicircles of increasing radius centered at the marine survey source 126, representing a down-going wavefield 128, following a signal emitted by the marine survey source 126. For ease of illustration and consideration with respect to the detail shown in FIG. 1, the down-going wavefield 128 may be considered as a combined output of both a marine impulsive source and a marine non-impulsive source. The down-going wavefield 128 is, in effect, shown in a vertical plane cross section in FIG. 1. The outward and downward expanding down-going wavefield 128 may eventually reach the surface 104, at which point the outward and downward expanding down-going wavefield 128 may partially scatter, may partially reflect back toward the streamers 120, and may partially refract downward into the subsurface volume 106, becoming elastic signals within the subsurface volume 106.

Figure 2:
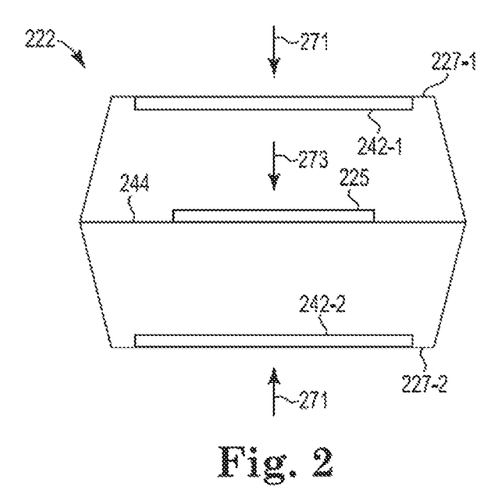
FIG. 2 illustrates a schematic diagram of a sensor that generates pressure and acceleration signals.

FIG. 2 illustrates a schematic diagram of a sensor 222 that generates pressure and acceleration signals. Sensor 222 can be analogous to or a component of receiver 122 illustrated in FIG. 1. In at least one embodiment, the sensor 222 includes a hydrophone housing an accelerometer. For instance, the hydrophone includes piezoelectric structures 242-1 and 242-2 coupled to opposing parallel walls 227-1 and 227-2, respectively, of sensor 222, and the accelerometer includes substrate 244 and piezoelectric structure 225. The sensor 222 is configured to be embedded in a marine streamer in at least one embodiment.

In at least one embodiment, piezoelectric structure 242-1 creates a first electrical charge differential in response to deformation of wall 227-1 and piezoelectric structure 242-2 creates a second electrical charge differential in response to deformation of wall 227-2. For instance, arrows 271 indicate sensor 222, and particularly elements of the hydrophone, being subjected to pressure. Pressure, as used herein, includes compressive pressure, which may also be referred to as an increase in pressure versus a previous state. The pressure may be greater than an internal pressure of the hydrophone. For instance, a piezoelectric structure such as piezoelectric structures 242 and 225 can generate an electric potential in response to a surface thereof being subjected to an external force. An example of the external force is pressure, which is force over area. Another example of the external force can result from acceleration, such as a unilateral force resulting from acceleration. Piezoelectric structures 242 and 225 are piezoceramics in at least one embodiment.

Substrate 244, which may be flexible, may be mechanically coupled to a pressure-insensitive support structure of sensor 222, and may span an interior of sensor 222. In at least one embodiment, piezoelectric structure 225 is coupled to the substrate 244 such that piezoelectric structure creates an electrical charge differential in response to deformation of the substrate 244. For instance, arrow 273 indicates sensor 222, and particularly elements of the accelerometer, being subjected to acceleration. Sensor 222 can be subjected to pressure and acceleration simultaneously in at least one embodiment. For instance, if sensor 222 is a component of a receiver of a streamer, the hydrophone can be subjected to pressure from a reflected wavefield as well as vibration in the streamer. Vibration in the streamer can be caused by the reflected wavefield or waves in the water, which in turn can subject the accelerometer to acceleration. While sensor 222 is illustrated in FIG. 2 as a hexagon-shaped sensor, examples are not so limited. For instance, sensor 222 may be a cylindrical shape, quadrilateral shape, or other shape having opposing parallel walls.

Figure 3:
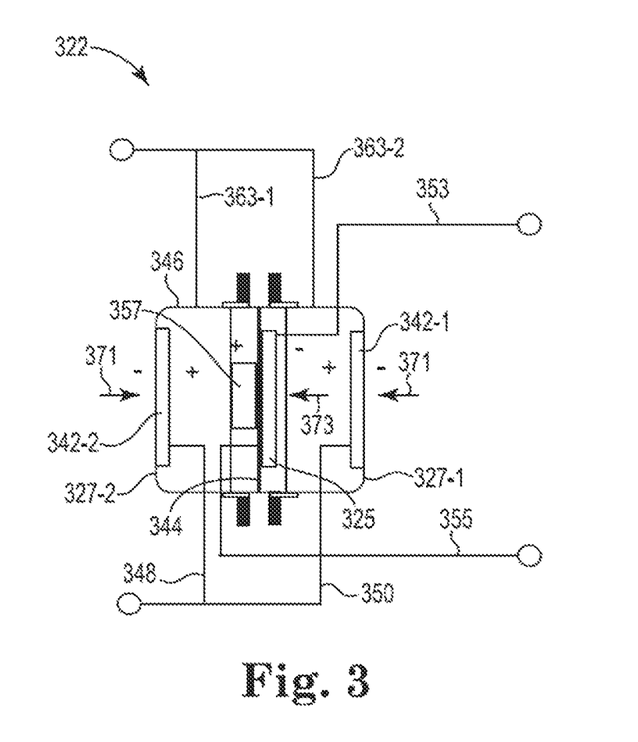
FIG. 3 illustrates a schematic diagram of another sensor that generates pressure and acceleration signals.

FIG. 3 illustrates a schematic diagram of another sensor 322 that generates pressure and acceleration signals. Sensor 322 comprises enclosure 346 having opposing parallel walls 327. Enclosure 346, in at least one embodiment, is air-tight. For instance, enclosure 346 may be hermetically sealed. Enclosure 346 can comprise a metal such as brass or can be a non-metal. Parallel walls 327, in at least one embodiment, are of equal size and rigidity or approximately equal size and rigidity but are less rigid as compared other walls of enclosure 346. As used herein, "approximately" can include a value within a particular margin, range, and/or threshold.

Enclosure 346 houses piezoelectric structure 342-1, piezoelectric structure 342-2, and piezoelectric structure 325. In at least one embodiment, piezoelectric structure 342-1 and piezoelectric structure 342-2 are elements of a hydrophone, and piezoelectric structure 325 is an accelerometer element. Piezoelectric structure 342-1 is mechanically coupled to the wall 327-1 such that the piezoelectric structure 342-1 creates an electrical charge differential in response to deformation of parallel wall 327-1. Piezoelectric structure 342-2 is mechanically coupled to wall 327-2 such that the piezoelectric structure 342-2 creates an electrical charge differential in response to deformation of parallel wall 327-2. For instance, arrows 371 indicate sensor 322, and particularly elements of the hydrophone, being subjected to pressure. That pressure can deform parallel wall 327-2 and thus cause piezoelectric structure 342-2 to create an electrical charge differential.

In at least one embodiment, piezoelectric structure 325 is coupled to the substrate 344 such that piezoelectric structure 325 creates an electrical charge differential in response to deformation of the substrate 344. For instance, arrow 373 indicates sensor 322, and particularly elements of the accelerometer, being subjected to acceleration. While sensor 322 is illustrated in FIG. 3 as a square with rounded edges-shaped sensor, examples are not so limited.

In at least one embodiment, sensor 322 includes an electrical connection 350 to the piezoelectric structure 342-1 and an electrical connection 348 to piezoelectric structure 342-2. In at least one embodiment, sensor 322 includes an electrical connection 353 that is coupled to piezoelectric structure 325 and an electrical connection 355 that is coupled to substrate 344. Sensor 322, in at least one embodiment, includes electrical connections 363-1 and 363-2 coupled to an enclosure 346 of sensor 322. In at least one embodiment, sensor 322 includes a weight 357 coupled to substrate 344. In another embodiment, weight 357 can be coupled to piezoelectric structure 325. Weight 357 can add sensitivity to the sensor and improve performance of signal readings.

Figure 4:
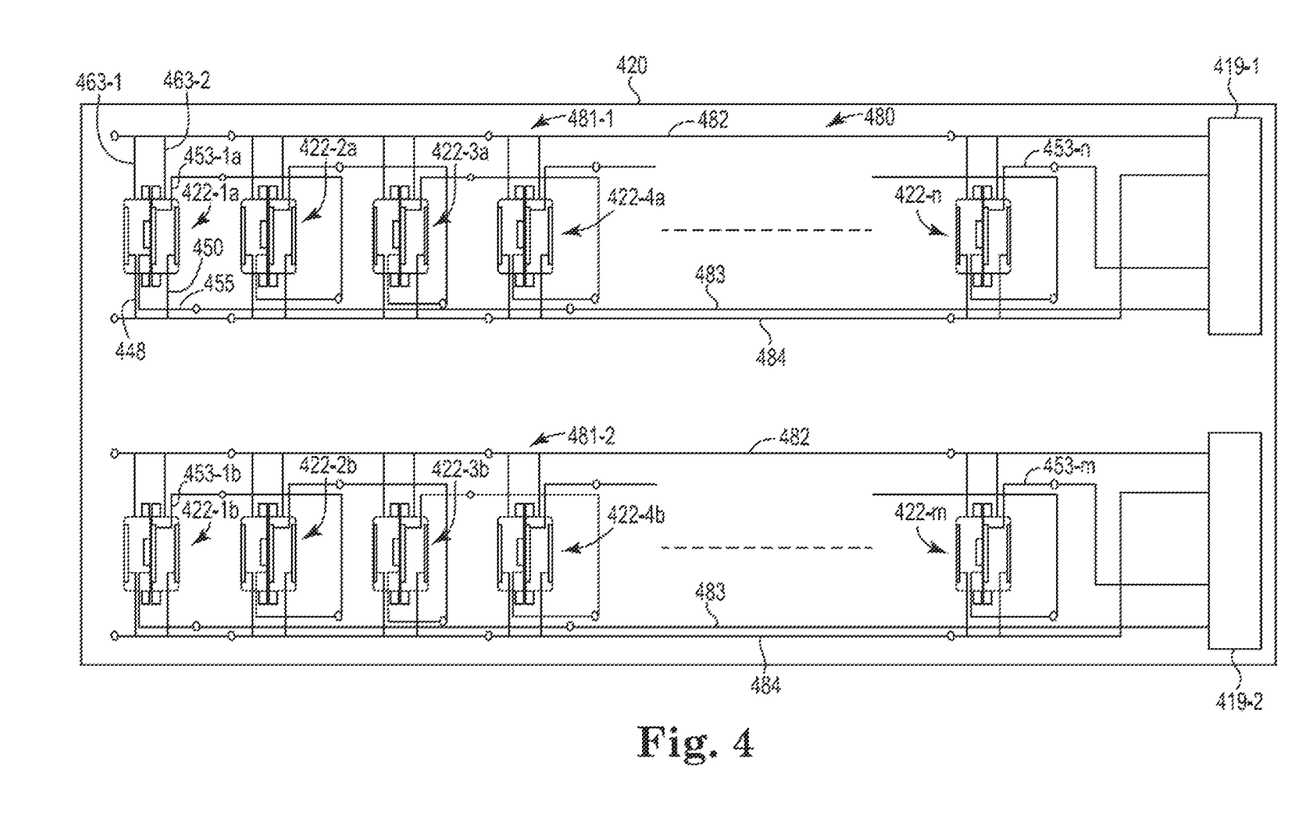
FIG. 4 illustrates a schematic diagram of a system including an exemplary array of sensors for measuring acceleration and pressure.

FIG. 4 illustrates a schematic diagram of a system including an exemplary array 480 of sensors 422 embedded in a streamer 420 for measuring acceleration and pressure. The array 480 can comprise a first subarray 481-1 comprising a plurality of sensors 422-1a, . . . , 422-n and a second subarray 481-2 comprising a plurality of sensors 422-1b, 422-2b, 422-3b, 422-4b, . . . , 422-m. In at least one embodiment, each sensor 422 of the first subarray 481-1 and each sensor 422 of the second subarray 481-2 comprises a hydrophone and an accelerometer. First subarray 481-1 and second subarray 481-2 are perpendicular to one another in at least one embodiment, as will be discussed with respect to FIG. 5.

Although FIG. 4 illustrates the first subarray 481-1 comprising the sensors 422-1a, 422-2a, 422-3a, 422-4a, . . . , 422-n and the second subarray 422-2 comprising the sensors 422-1b, 422-2b, 422-3b, 422-4b, . . . , 422-m, the first subarray 422-1 and the second subarray 422-2 can comprise any quantity of the sensors 422. The sensors 422-1a through 422-n and 422-1b through 422-m are referred to collectively as the sensors 422 and can be analogous to the sensor 222 or 322 illustrated in FIGS. 2 and 3. For instance, each sensor 422 can comprise an enclosure, a first piezoelectric structure within the enclosure, a second piezoelectric structure within the enclosure, and a third piezoelectric structure within the enclosure. As will be described further herein, a first lead can be coupled to the first piezoelectric structure and the second piezoelectric structure such that a pressure can be measured by the hydrophone and a second lead can be coupled to the third piezoelectric structure such that an acceleration can be measured by the accelerometer.

The first subarray 422-1 can comprise a different quantity of the sensors than the second subarray 422-2. As will be appreciated by one of ordinary skill of the art, noise performance, such as that shown on a relative coherence measure (RCM) plot, can be improved when the first subarray 422-1 or the second subarray 422-2 comprises a large quantity of the sensors 422 such that the noise performance is proportional to the square root of the quantity of the sensors 422. In at least one embodiment, sensors 422 within a subarray are parallel in orientation. For instance, a first sensor 422-1a in the first subarray 481-1 is parallel to a second sensor 422-2a in the first subarray 481-1 and a second sensor 422-1b in the second subarray 481-2 is parallel to a second sensor 422-2b in the second subarray 481-2.

As shown in FIG. 4, the first subarray 481-1 and second subarray 481-2 can each have leads 482, 483, and 484. The lead 484 is coupled to a piezoelectric structure of each sensor 422 of the first subarray 481-1 or the second subarray 481-2, such as the first piezoelectric structure 342-1 as illustrated in FIG. 3, the second piezoelectric structure 341-2 as illustrated in FIG. 3, or both. Lead 484 is coupled to the piezoelectric structure via electrical connections 448 and 450 in at least one embodiment such that a pressure can be measured.

Lead 483 is coupled to a substrate of each sensor 422 of the first subarray 481-1 or the second subarray 481-2 such as substrate 244 or 344 illustrated in FIGS. 2 and 3 via electrical connection 455. Lead 482 is coupled to an enclosure of each sensor 422 of the first subarray 481-1 or the second subarray 481-2 such as enclosure 346 illustrated in FIG. 3 independent of leads 484 and 483. The enclosure, in at least one embodiment, may be a rigid support structure of a hydrophone of sensor 222.

A piezoelectric structure, such as piezoelectric structures 225 and 325 illustrated in FIGS. 2 and 3 may be electrically connected within the first subarray 481-1 or the second subarray 481-2 to a subsequent substrate such as substrate 244 or 344 illustrated in FIGS. 2 and 3 via electrical connection 453-1a. For instance, a substrate of a first sensor 422-1a in first subarray 481-1 may be coupled to lead 483 via electrical connection 455. However, a substrate such as substrates 244 and 344 illustrated in FIGS. 2 and 3 of a second sensor 422-2a in first subarray 481-1 may not be directly coupled to a lead, but instead is electrically connected to a piezoelectric structure such as piezoelectric structures 225 and 325 illustrated in FIGS. 2 and 3. of previous sensor 422-1a. A piezoelectric structure such as piezoelectric structures 225 and 325 illustrated in FIGS. 2 and 3 in a last sensor 422-n of first subarray 481-1 may include a coupling to controller 419-1 via electrical connection 453-n in at least one embodiment. In at least one embodiment electrical connection 453 is a lead coupled to the third piezoelectric structure such that an acceleration can be measured.

Put another way, elements of the accelerometer portion of sensor 422 may be coupled such that a lead in the first sensor 422-1a of a first subarray 481-1, may be coupled to an accelerometer element of a subsequent sensor 422-2a (and so on) of the first subarray 481-1 in intermediate sensors, and may be coupled to a controller 419-1 of the first subarray 481-1 in a last sensor 422-n of the first subarray 481-1. A similar or same configuration occurs in second subarray 481-2, for instance, in at least one embodiment, electrical connections are the same in second subarray 481-2 as those illustrated in first subarray 481-1.

In at least one embodiment, acceleration is measured by the third piezoelectric structure simultaneously to pressure being measured by the first piezoelectric structure and the second piezoelectric structure. Controller 419 coupled to leads 482, 483, 484, and electrical connection 453 can simultaneously determine the pressure and the acceleration based on pressure signals from the first piezoelectric structure and the second piezoelectric structure and acceleration signals from the third piezoelectric structure.

For instance, controller 419, in at least one embodiment, is coupled to the first subarray 481-1 and the second subarray 481-2 and is configured to simultaneously determine a first voltage signal and a second voltage signal from each sensor in the first subarray of sensors and the second subarray of sensors using triple piezoelectric structures. The first voltage signal represents pressure of a respective sensor in the first subarray 481-1 and the second subarray 481-2. The second voltage signal represents acceleration of a respective sensor in the first subarray 481-1 and the second subarray 481-2. The triple piezoelectric structures include a first piezoelectric structure of the hydrophone, a second piezoelectric structure of the hydrophone, and a third piezoelectric structure of the accelerometer. The controller determines vertical components, horizontal components, or both horizontal and vertical components of acceleration associated with the first sensor subarray and the second sensor subarray based on the simultaneous determination, in at least one embodiment. The vertical and horizontal component be used to reduce noise in at least one embodiment.

At least one embodiment can include controllers 419-1 and 419-2 coupled to the subarrays 481-1 and 481-2; however, embodiments are not so limited. More than two controllers may be present, and each sensory subarray may not have its own controller. Controllers 419 are analogous to controller 119 of FIG. 1, in at least one embodiment. Controllers 419 may be acquisition unit (AU) nodes in at least one embodiment. The leads 482, 483, 484, and electrical connection 453-n of the first subarray 481-1 can be coupled to a first controller 419-1. Similarly, leads 482, 483, 484, and electrical connection 453-m of the second subarray 481-2 can be coupled to a second controller 419-2. In at least one embodiment, a single controller 419 is coupled to all subarrays of array 480. Put another way, signals from all subarrays of array 480 may be collected at a single AU node.

In at least one embodiment, signals obtained from hydrophone elements via electrical connections 448 and 450 and lead 484 can go directly to controller 419. Sensor acceleration can be calculated from signals obtained from accelerometer elements via electrical connections 453, lead 483, and an inclinometer coupled to controller 419. For example, vertical acceleration components, horizontal components, or both vertical and horizontal components can be determined using signals obtained from hydrophone- and accelerometer-obtained signals. In at least one embodiment, the aforementioned signals are obtained simultaneously, measured simultaneously, or both. Embodiments can include controllers and AU nodes known to one of ordinary skill in the art.

For instance, controller 419 can be analogous to or implemented by the controller 119 illustrated in FIG. 1. In at least one embodiment, the controller 419 can represent functionality that is partially implemented by the controller 119 illustrated in FIG. 1 and partially implemented by a different controller, such as a different controller onboard the marine survey vessel or on shore. For example, the controller 419 being analogous to the controller 119 illustrated in FIG. 1 can be configured to receive data from sensors 422, while a different controller can be configured to perform other functions described herein. For ease of explanation, the controller 419 may be referred to herein as a single physical controller, however embodiments are not so limited. Controller 419 can utilize software, hardware, firmware, and/or logic to perform a number of functions.

Controller 419 can be a combination of hardware and executable instructions configured to perform a number of functions (e.g., actions). The hardware, for example, can be a processor, in at least one embodiment. Such a processor may be coupled to a memory resource, such as a machine-readable medium or other non-transitory memory resource. The memory resource can be internal and/or external to the controller. Executable instructions can be stored on the machine-readable medium as machine-readable and executable and to implement a particular function. For example, the executable instructions can be executed by the processor. The memory resource can be coupled to the controller 419 in a wired and/or wireless manner. For example, the memory resource can be an internal memory, a portable memory, a portable disk, and/or a memory associated with another resource, for example, enabling the executable instructions to be transferred and/or executed across a network such as the Internet. In at least one embodiment, the memory resource can be a plurality of non-transitory machine-readable media.

While not illustrated in FIG. 4, in at least one embodiment, the first subarray 481-1 can be a component of a first streamer, such as the streamer 420, and the second subarray 481-2 can be a component of a second streamer. In at least one embodiment, a first sensor of an array of sensors can be spaced apart from a second sensor of the array of sensors by a particular distance. For example, the sensor 422-1 and the hydrophone 422-2 can be separated by 0.2 to 0.3 m, which can reduce noise. Sensors, such as the sensors 422 that are component of the receivers 122 on the streamers 120 illustrated in FIG. 1, can be subjected to slow moving waves that may go through the streamers at, for example, 30 to 40 m/s. Spacing sensors apart by a short distance can reduce noise caused by these slow-moving waves because the distance between the sensors is much shorter than the slow-moving waves. Thus, only a few of the sensors may be affected by a slow-moving wave at one time.

In at least one embodiment, the first array 422-1 can comprise a first component of streamer 420 and the second array 422-2 can comprise a second component of the streamer 420. For example, the first component can comprise 6.25 m of a streamer and the second component can comprise 3.125 m of the streamer. The first array 481-1 and the second array 481-2 can comprise the same or different lengths of one or more streamers. In at least one embodiment, 8 to 32 of the sensors 422 can be spaced apart evenly along 12.5 m of a streamer.

Figure 5:
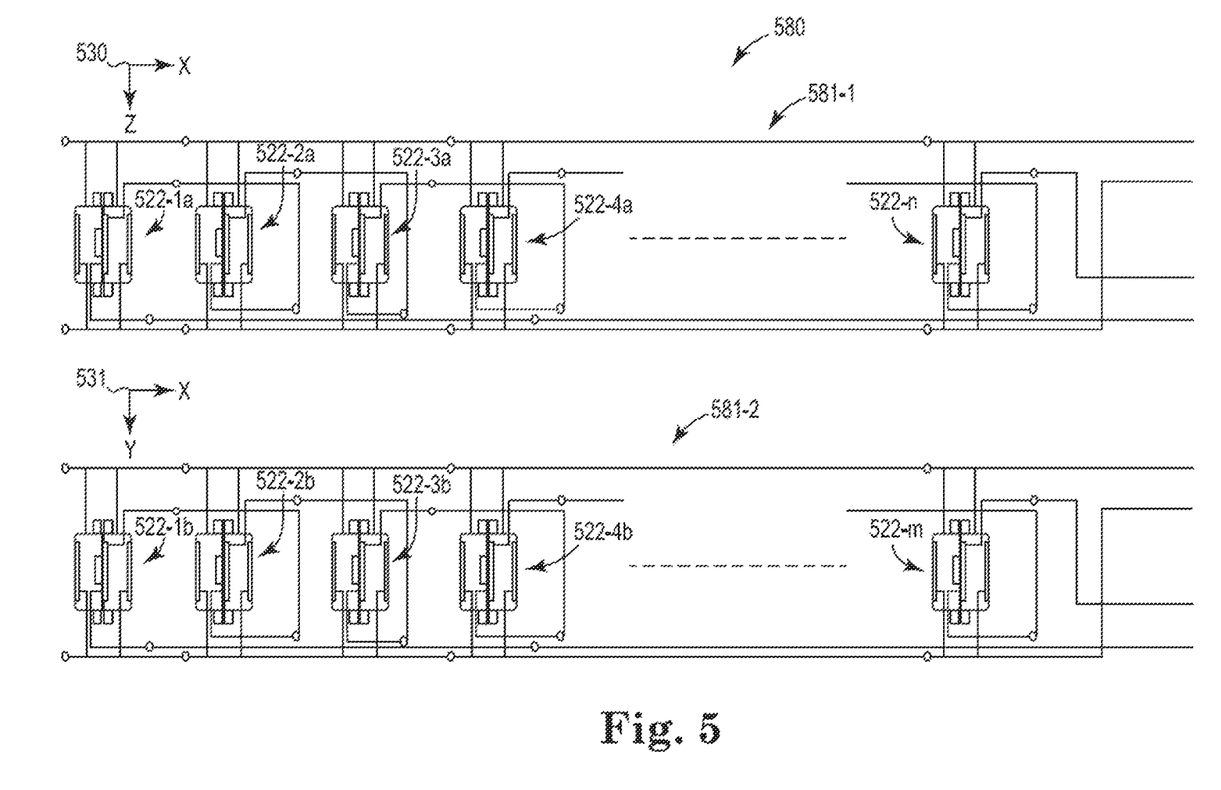
FIG. 5 illustrates a schematic diagram of an exemplary array of sensors for measuring acceleration and pressure.

FIG. 5 illustrates a schematic diagram of an exemplary array 580 of sensors 522 for measuring acceleration and pressure. FIG. 5 illustrates a schematic diagram of a first subarray 581-1 of sensors 522 oriented in the xz-plane 530 for measuring acceleration and pressure and a second subarray 581-2 of sensors 522 oriented in the xy-plane 531 for measuring acceleration and pressure. The first subarray 581-1 can be analogous to the first subarray 481-1 and the second subarray 581-2 can be analogous to the subarray 481-2 illustrated in FIG. 4. The sensors 522-1a through 522-n can be analogous to the sensors 222 and 322 illustrated in FIGS. 2 and 3.

First subarray 581-1 can be oriented in a first orientation (in the xz-plane 530) and the second subarray 581-2 can be oriented in a second orientation perpendicular to the first orientation (in the xy-plane 531). The sensors 522-1a through 522-n of the first subarray 581-1 are oriented in the xz-plane 530 such that pressure and acceleration can be detected in the xz-plane 530. In contrast, the sensors 522-1b through 522-m of the second subarray 581-2 are oriented in the xy-plane 531 such that pressure and acceleration can be detected in the xy-plane 531. Together the subarrays 581-1 and 581-2 can simultaneously obtain both the vertical component and the horizontal component of acceleration of a reflected wavefield. A controller such as controller 419 illustrated in FIG. 4 can determine the vertical component and the horizontal component, for instance in collaboration with an inclinometer, and can reduce sensor accelerometer noise in at least one embodiment.

Figure 6:
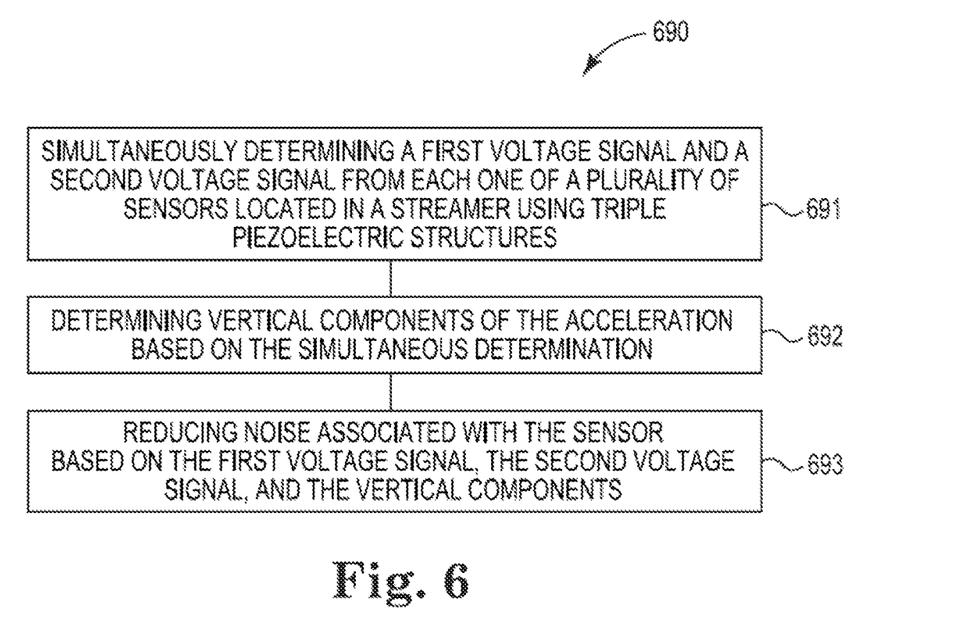
FIG. 6 illustrates an exemplary method for pressure and acceleration measurement.

FIG. 6 illustrates an exemplary method 690 for pressure and acceleration measurement. At 691, method 690 includes simultaneously determining a first voltage signal and a second voltage signal from each one of a plurality of sensors located in a streamer using triple piezoelectric structures. In at least one embodiment, the first voltage signal represents pressure of a respective one of the plurality of sensors. The pressure can be determined based on a pressure signal received via a first lead coupled to a first piezoelectric structure and a second piezoelectric structure of the triple piezoelectric structures, in at least one embodiment.

The second voltage signal represents acceleration of a respective one of the plurality of sensors, and at 692, the method includes determining vertical components of the acceleration based on the simultaneous determination. In at least one embodiment, a determination of the vertical components of the acceleration is based on an inclinometer measurement and an acceleration signal received via a second lead coupled to a third piezoelectric structure of the triple piezoelectric structures. Horizontal components of the acceleration are determined in at least one embodiment.

In at least one embodiment, determining the first voltage signal and the second voltage signal can include using the triple piezoelectric structures to measure pressure and acceleration. For instance, signals from a hydrophone portion of a sensor comprising the first piezoelectric structure and the second piezoelectric structure are used for pressure determinations, which can occur simultaneously to acceleration determinations made using signals from an accelerometer portion of the sensor comprising the third piezoelectric structure. In at least one embodiment, the plurality of sensors is located on the streamer in a first sensor subarray oriented in an orientation that is perpendicular to an orientation of a second sensor subarray of the streamer.

At 693, noise associated with the sensor is reduced based on the determination. For instance, ghost reflection noise can be reduced or minimized using the determined vertical and horizontal components of the acceleration, resulting in improved seismic data. For example, vertical components of the acceleration can be combined with pressure determinations to achieve deghosting.

In at least one embodiment, the method 690 described with respect to FIG. 6 includes a process for pressure and acceleration measurement, wherein the method is a specific improvement consisting of one or more of elements 691, 692, and 693. In at least one embodiment, the specific improvement includes an improved wiring arrangement of sensors and sensor arrays embedded in a streamer and improved noise performance based on signals collected using the improved arrangement. In at least one embodiment, the specific improvement is an improvement to the technological process of marine seismic surveying that reduces the cost of data acquisition by reducing noise, improving deghosting, and improving pressure and acceleration measurements resulting in improved efficiency, thereby reducing the amount of fuel used as well as the time used for data acquisition.

In accordance with a number of embodiments of the present disclosure, a geophysical data product may be produced. The geophysical data product may include, for example, field data recorded during a survey utilizing the above-described techniques. Geophysical data may be obtained and stored on a non-transitory, tangible computer-readable medium. In some instances, geophysical analysis may be performed on the geophysical data product offshore according to techniques described herein or known in the art, and stored on a computer-readable medium, to produce an enhanced geophysical data product.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Various advantages of the present disclosure have been described herein, but embodiments may provide some, all, or none of such advantages, or may provide other advantages.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A system, comprising:
  a marine seismic streamer defining a longitudinal dimension and an interior volume;
  a first plurality of sensors disposed in the interior volume and spaced apart in the longitudinal dimension according to a first spacing interval; and
  a controller disposed in the interior volume;
  wherein each of the first plural sensors comprises:
    an enclosure having two opposing interior walls;
    first and second piezoelectric elements disposed on the opposing interior walls of the enclosure;
    a third piezoelectric element disposed on a flexible substrate within the enclosure and between the opposing interior walls;
    a pressure signal output node disposed on an exterior surface of the enclosure and coupled to the first and the second piezoelectric elements; and
    an acceleration signal output node disposed on the exterior surface of the enclosure, distinct from the pressure signal output node, and coupled to the third piezoelectric element;
  wherein a first combined pressure signal derived from the pressure signal output nodes of the first plural sensors is coupled to a pressure signal input of the controller; and
  wherein a first combined acceleration signal derived from the acceleration signal output nodes of the first plural sensors is coupled to an acceleration signal input of the controller.

2. The system of claim 1:
  wherein the first combined pressure signal comprises a parallel connection of pressure signal outputs of the first plural sensors.

3. The system of claim 1:
  wherein the first combined acceleration signal comprises a series connection of pressure signal outputs of the first plural sensors.

4. The system of claim 1, wherein:
the first combined pressure signal comprises a parallel connection of pressure signal outputs of the first plural sensors; and
the first combined acceleration signal comprises a series connection of pressure signal outputs of the first plural sensors.

5. The system of claim 1:
further comprising an inclinometer having an inclinometer signal output; and
wherein the inclinometer signal output is coupled to an inclinometer signal input of the controller.

6. The system of claim 5, wherein:
the controller is configured to determine a vertical acceleration signal based on the acceleration signal input and the inclinometer signal input.

7. The system of claim 5, wherein:
the inclinometer is distinct from the first plural sensors.

8. The system of claim 1, wherein:
the first spacing interval is between 0.2 and 0.3 meters.

9. The system of claim 1, further comprising:
a second plurality of sensors disposed in the interior volume and spaced apart in the longitudinal dimension according to a second spacing interval;
wherein each of the second plural sensors is physically identical to each of the first plural sensors; but
wherein a plane of the third piezoelectric element in each of the second plural sensors is oriented at a 90 degree offset relative to a corresponding plane of the third piezoelectric element in each of the first plural sensors.

10. The system claim 9, wherein:
a second combined pressure signal derived from pressure signal output nodes of the second plural sensors is coupled to a second controller; and
a second combined acceleration signal derived from acceleration signal output nodes of the second plural sensors is coupled to the second controller.

11. The system of claim 10, wherein:
the controller and the second controller are distinct controllers.

12. The system of claim 9:
wherein the second spacing interval is between 0.2 and 0.3 meters.

13. The system of claim 1, wherein:
the third piezoelectric element is disposed between the first and the second piezoelectric elements.

14. The system of claim 1, wherein:
each of the first, second and third piezoelectric elements is generally planar such that the elements define respective first, second and third planes by their orientations; and
the first, second and third planes are parallel to one another.

15. A method, comprising:
towing a marine seismic streamer that defines a longitudinal dimension and an interior volume;
wherein the streamer comprises a first plurality of sensors disposed in the interior volume and spaced apart in the longitudinal dimension;
wherein each of the first plural sensors comprises:
an enclosure having two opposing interior walls;
first and second piezoelectric elements disposed on the opposing interior walls of the enclosure;
a third piezoelectric element disposed on a flexible substrate within the enclosure and between the opposing interior walls;
a pressure signal output node disposed on an exterior surface of the enclosure and coupled to the first and the second piezoelectric elements; and
an acceleration signal output node disposed on the exterior surface of the enclosure, distinct from the pressure signal output node, and coupled to the third piezoelectric element;
deriving a first combined pressure signal from the pressure signal output nodes of the first plural sensors; and
deriving a first combined acceleration signal from the acceleration signal output nodes of the first plural sensors.

16. The method of claim 15, further comprising:
recording the first combined pressure signal and the first combined acceleration signal in a tangible computer-readable medium, thereby manufacturing of a geophysical data product.

17. The method of claim 15, wherein:
the streamer further comprises an inclinometer; and
the method further comprises determining a vertical acceleration signal based on the first combined acceleration signal and the inclinometer output signal.

18. The method of claim 17, further comprising:
reducing ghost reflection noise by combining the first combined pressure signal with a signal derived from the vertical acceleration signal.

19. The method of claim 15:
wherein the streamer comprises a second plurality of sensors disposed in the interior volume and spaced apart in the longitudinal dimension;
wherein each of the second plural sensors is physically identical to each of the first plural sensors;
wherein a plane of the third piezoelectric element in each of the second plural sensors is oriented at a 90 degree offset relative to a corresponding plane of the third piezoelectric element in each of the first plural sensors; and
further comprising determining a horizontal acceleration signal based on combined acceleration outputs of the second plural sensors.

* * * * *